United States Patent
Sato

(10) Patent No.: US 8,324,556 B2
(45) Date of Patent: Dec. 4, 2012

(54) RADIATION DETECTOR

(75) Inventor: Kenji Sato, Otsu (JP)

(73) Assignee: Shimadzu Corporation, Kyoto (JP)

( * ) Notice: Subject to any disclaimer, the term of this patent is extended or adjusted under 35 U.S.C. 154(b) by 237 days.

(21) Appl. No.: 12/936,559

(22) PCT Filed: Apr. 7, 2009

(86) PCT No.: PCT/JP2009/001611
§ 371 (c)(1),
(2), (4) Date: Oct. 6, 2010

(87) PCT Pub. No.: WO2009/125584
PCT Pub. Date: Oct. 15, 2009

(65) Prior Publication Data
US 2011/0024749 A1 Feb. 3, 2011

(30) Foreign Application Priority Data
Apr. 8, 2008 (WO) .................. PCT/JP2008/056945

(51) Int. Cl.
*H01L 27/146* (2006.01)
(52) U.S. Cl. ... 250/214.1; 257/72; 257/444; 250/370.09
(58) Field of Classification Search ............... 250/214.1, 250/370.09, 208.1, 370.08, 370.1, 370.11, 250/370.15; 257/72, 444, 443, 429, 428, 257/448
See application file for complete search history.

(56) References Cited

U.S. PATENT DOCUMENTS

| | | | | |
|---|---|---|---|---|
| 6,635,860 | B2 * | 10/2003 | Sato et al. | 250/214.1 |
| 2002/0148949 | A1 | 10/2002 | Sato et al. | |
| 2003/0183749 | A1 * | 10/2003 | Tsutsui et al. | 250/214.1 |
| 2012/0080585 | A1 * | 4/2012 | Fukuzaki et al. | 250/214.1 |

FOREIGN PATENT DOCUMENTS

| | | |
|---|---|---|
| JP | 2002-9268 A | 1/2002 |
| JP | 2002-116259 A | 4/2002 |
| JP | 2002-311144 A | 10/2002 |

* cited by examiner

*Primary Examiner* — Michael Shingleton
(74) *Attorney, Agent, or Firm* — Cheng Law Group, PLLC

(57) ABSTRACT

A radiation detector of this invention has an insulating, non-amine barrier layer disposed between exposed surfaces of a radiation sensitive semiconductor layer, a carrier selective high resistance film and a common electrode, and a curable synthetic resin film.

This barrier layer can further inhibit a chemical reaction between the semiconductor layer and curable synthetic resin film, and can prevent an increase in dark current which flows through the semiconductor layer. Since no chemical reaction occurs between the barrier layer and semiconductor layer, the semiconductor layer will never be degraded. Further, with an auxiliary plate disposed on an upper surface of the curable synthetic resin film, it is possible to manufacture a radiation detector free from warpage and cracking due to temperature change.

14 Claims, 6 Drawing Sheets

RADIATION DETECTOR

TECHNICAL FIELD

This invention relates to a radiation detector for industrial or medical use, and more particularly to a construction of a radiation detector which converts radiation directly into carriers.

BACKGROUND ART

Conventionally, a direct conversion type radiation detector which converts radiation directly into carriers (charge information) in a semiconductor layer applies a predetermined bias voltage to a common electrode formed on a front surface of the semiconductor layer which is sensitive to radiation, and collects the carriers thereby generated in the semiconductor layer in pixel electrodes formed on a back surface of the semiconductor layer. Further, the carriers collected are taken out as radiation detection signals, thereby to detect the radiation.

Where an amorphous semiconductor layer such as a-Se (amorphous selenium), in particular, is used as the radiation sensitive semiconductor layer, a large and thick semiconductor layer can be formed easily by a method such as vacuum vapor deposition. Thus, the amorphous semiconductor layer can be constructed as a radiation conversion layer of a two-dimensional array type radiation detector.

However, since the direct conversion type radiation detector applies a high voltage to the common electrode for use, there arise problems of dark current increase and creeping discharge. Further, the radiation detector having the larger area is the more likely to encounter a problem of warpage and cracking due to temperature change. First, in Patent Document 1 and in FIG. 6, a carrier selective high resistance film 5 is inserted between a common electrode 3 and a semiconductor layer 1 as a measure to reduce dark current. In order to solve the problem of creeping discharge, a curable synthetic resin film 7 (silicone resin) as an insulating layer of high withstand voltage covers entire surfaces of the amorphous semiconductor layer 1, carrier selective high resistance film 5 and common electrode 3. With this structure, however, temperature change will cause warpage of the radiation detector, and form cracks in the curable synthetic resin film 7, amorphous semiconductor layer 1, common electrode 3 and/or carrier selective high resistance film 5. A creeping discharge voltage resistance will become insufficient.

So, in Patent Document 2 and in FIG. 7, to prevent warpage and cracking from occurring with the radiation detector, an auxiliary plate 9 with a thermal expansion coefficient comparable to that of an insulating substrate 11 is fixed to pinch the curable synthetic resin film 7 of high withstand voltage with the insulating substrate 11. When silicone resin is used as the curable synthetic resin film 7 here, since silicone resin is inferior in hardness, warpage by thermal contraction of the radiation detector cannot be inhibited, but cracking will occur with the amorphous semiconductor layer 1, common electrode 3 and carrier selective high resistance film 5. For the above reason, an epoxy resin is used as the curable synthetic resin film 7 in Patent Document 2.

However, Patent Document 2 indicates a problem that the solvent component of the epoxy resin reacts with a-Se which is the amorphous semiconductor layer 1, to discolor the surface of the amorphous semiconductor layer 1 and to lower the withstand voltage. So, in Patent Document 2 and in FIG. 7, the high resistance film 5 such as $Sb_2S_3$ film having solvent resistance and carrier selectivity covers the entire surface of the amorphous semiconductor layer 1. This reduces the reaction between the solvent component of epoxy resin and a-Se, thereby to eliminate discoloring of the surface of the amorphous semiconductor layer 1 and lowering of the withstand voltage.

In Patent Document 3, a silane compound is used as the curable synthetic resin film 7 as a solution to the problem of warpage and cracking. This can make the thermal expansion coefficient of a mold material, itself, which consists of a silane compound, the same as that of the insulating substrate, whereby warpage and cracking can be inhibited without using the auxiliary plate 9.

[Patent Document 1]
Unexamined Patent Publication No. 2002-009268
[Patent Document 2]
Unexamined Patent Publication No. 2002-311144
[Patent Document 3]
Unexamined Patent Publication No. 2002-116259

DISCLOSURE OF THE INVENTION

Problem to be Solved by the Invention

However, a new problem not disclosed in the above documents has been found. It is a fact that, although the entire surface of the amorphous semiconductor layer 1 is covered with the solvent resistant and carrier selective high resistance film 5 as shown in FIG. 7, the a-Se of the amorphous semiconductor layer 1 reacts with the solvent of the epoxy resin which is the curable synthetic resin film 7. It has newly been confirmed that, although this reaction is relatively minor and there occurs no discoloration of the surface of the amorphous semiconductor layer 1 or lowering of the withstand voltage, performance deterioration such as an increase in dark current takes place upon elapse of a long time. FIG. 8 is a photo showing the intensity of dark current detected in the radiation detector having the structure of FIG. 7. The intensity of dark current is shown in white shading so that pixel areas with large dark current may appear white. According to this photo, resistivity has lowered in pixel areas where the solvent of the epoxy resin and the amorphous semiconductor reacted, dark current due to application of a bias voltage has increased, although not irradiated with radiation, and the dark current appears white on the picture.

Although the silane compound is equal in thermal expansion coefficient with a glass substrate which is the insulating substrate 11, a thickness of at least several millimeters and a crosslink formation by perfect hydrolysis reaction are required in order to secure a strength to withstand the thermal expansion and contraction of the a-Se semiconductor layer. However, in order to obtain a coating film on a large-area semiconductor layer, dissolution in an organic solvent is needed in the middle of the crosslinking reaction. Consequently, the concentration of the silane compound lowers, thereby failing to secure sufficient strength. In order to secure strength, it is necessary to form a high-concentration thick film by volatilizing the organic solvent completely after coating, and it must be heated to at least 40° C. or more and 80° C. or less. Although curing of the silane compound is promoted by this heating, there has arisen a problem that the a-Se semiconductor layer crystallizes from the amorphous state. That is, since the amorphous semiconductor like a-Se has a low glass transition temperature, a curable synthetic resin film 7 which cures at normal temperature must be selected.

This invention has been made having regard to the state of the art noted above, and its object is to provide a radiation detector which inhibits an increase in dark current by preventing the chemical reaction of the amorphous semiconductor layer 1 and the solvent component of the curable synthetic resin film 7, which prevents crystallization of the amorphous semiconductor when curing the curable synthetic resin film 7, and which is free from warpage and cracking due to temperature change.

Means for Solving the Problem

Inventor herein has made intensive research and attained the following findings. First, in order to determine what material reacts with a-Se, the base resin and the curing agent of an epoxy resin were each applied to a-Se. Then, no degradation of a-Se has been recognized on the surface to which the base resin of the epoxy resin was applied, but on the surface to which the curing agent was applied, a degradation of a-Se showing an increase in dark current has been recognized. Based on the above experiment, it is estimated that, among the solvent components of the epoxy resin, the component which reacts with a-Se is an amine compound included in the curing agent.

It has also been found that, although, as shown in FIG. 7, the entire surface of the amorphous semiconductor layer 1 is covered with the carrier selective high resistance film 5, the cause of the amorphous semiconductor layer 1 chemically reacting with the amine compound of the curing agent of the epoxy resin is attributable to the fact that the carrier selective high resistance film 5 is not a completely dense film as shown in FIG. 9. FIG. 9 is an electron microgram of a section of the carrier selective high resistance film 5. It has been found from this picture that there is a non-dense area inside the carrier selective high resistance film 5. In order to eliminate the influence of this incomplete density of the carrier selective high resistance film 5 and to prevent penetration of the amine compound, the thickness of the carrier selective high resistance film 5 must be increased. However, the greater thickness will result in the lower mobility of carriers, and radiation detection sensitivity will fall especially when it exceeds several micrometers. Thus, there is a limit to increasing the thickness of the carrier selective high resistance film 5. Then, a radiation detector free from an increase in dark current can be manufactured by newly forming a barrier layer to inhibit the chemical reaction between the amorphous semiconductor layer 1 and the amine compound of the curing agent of the curable synthetic resin film 7 without increasing the thickness of the carrier selective high resistance film 5.

To fulfill the above object, this invention provides the following construction.

A radiation detector of this invention comprises (a) a radiation sensitive semiconductor layer for generating carriers upon incidence of radiation, (b) a high resistance film formed on an upper surface of the semiconductor layer for selecting and transmitting the carriers, (c) a common electrode formed on an upper surface of the high resistance film for applying a bias voltage to the high resistance film and the semiconductor layer, (d) a matrix substrate formed on a lower surface of the semiconductor layer for reading, on a pixel-by-pixel basis, the carriers generated in the semiconductor layer, (e) a barrier layer covering entire exposed surfaces of the semiconductor layer, the high resistance film and the common electrode, (f) a curable synthetic resin film covering an entire surface of the barrier layer, and (g) an insulating auxiliary plate fixed to an upper surface of the curable synthetic resin film, and having a thermal expansion coefficient comparable to that of the matrix substrate, wherein (h) the barrier layer is adhesive to the curable synthetic resin film, (i) the barrier layer inhibits a chemical reaction between the semiconductor layer and the curable synthetic resin film, and (j) the barrier layer does not chemically react with the semiconductor layer.

According to the radiation detector of this invention, a barrier layer is newly provided between the exposed surfaces of the semiconductor layer, high resistance film and common electrode, and the curable synthetic resin film, thereby to further inhibit the chemical reaction between the semiconductor layer and curable synthetic resin film. Since no chemical reaction occurs between the barrier layer and semiconductor layer, the semiconductor layer is never degraded. An increase in dark current can be prevented by forming the high resistance film between the common electrode and semiconductor layer. The barrier layer which is adhesive to the curable synthetic resin film reduces concentration of distortion due to mechanical stress. Further, with the semiconductor layer and curable synthetic resin film held between the auxiliary plate and matrix substrate, it is possible to manufacture a radiation detector free from warpage and cracking due to temperature change.

In the above radiation detector, the matrix substrate may be an active matrix substrate having pixel electrodes for collecting, on a pixel-by-pixel basis, the carriers generated in the semiconductor layer, capacitors for storing charges corresponding to the number of carriers collected, switching elements for reading, the charges stored, and electrode wires arranged in a grid pattern and connected to the switching elements arranged at respective grid points. This realizes manufacture of a radiation detector having a large viewing surface, and yet with little influence of cross talk.

In the above radiation detector, a-Se (amorphous selenium) may be employed as the semiconductor layer. This enables manufacture of a radiation detector with a large area. Further, an epoxy resin may be employed as the curable synthetic resin film. Since this has excellent adhesiveness to the auxiliary plate, there is no possibility of detachment at joint surfaces. The epoxy resin, with a high degree of hardness, can inhibit warpage and cracking due to temperature change.

Further, the barrier layer may be made thicker than the high resistance film to be able to inhibit the chemical reaction between the semiconductor layer and curable synthetic resin film, which could not be prevented by the high resistance film alone, thereby to prevent deterioration in performance of the semiconductor layer.

Where the barrier layer is a non-amine synthetic resin, no chemical reaction occurs between the barrier layer and semiconductor layer. Further, when the barrier layer is cured at a temperature below 40° C., the semiconductor layer, even with an amorphous structure, will not crystallize.

The barrier layer of non-amine, cold curable synthetic resin may for example, be a two-component type polycarbonate resin or urethane resin. A film of non-amine synthetic resin may be formed as the barrier layer by dissolves a non-amine synthetic resin in a non-amine solvent, applying this solution onto the exposed surfaces of the semiconductor layer, high resistance film and common electrode, and volatilizing the non-amine solvent at normal temperature. As examples of the above barrier layer, the non-amine synthetic resin may be polycarbonate resin or acrylic resin, and the non-amine solvent may be xylene or dichlorobenzene. The normal temperature as used in this application is a temperature below 40° C.

A photo-curable acrylic resin may be employed as the barrier layer of non-amine, cold curable synthetic resin.

As another example of the barrier layer, it may be formed by attaching a non-amine synthetic resin by vacuum vapor deposition to the exposed surfaces of the semiconductor layer, high resistance film and common electrode. The non-amine synthetic resin deposited may be polyparaxy-lylene.

The barrier layer is not limited to the non-amine synthetic resin film, but may be formed of the same material as the carrier selective high resistance film or a different inorganic high resistance film. The newly formed inorganic high resistance film is not intended for reducing dark current, but is intended to act as the barrier layer for inhibiting the chemical reaction between the semiconductor layer and curable synthetic resin film. Therefore, its thickness can be made larger than the carrier selective high resistance film formed between the semiconductor layer and common electrode.

Effects of the Invention

With the radiation detector according to this invention, a barrier layer is newly provided between the exposed surfaces of the semiconductor layer, high resistance film and common electrode, and the curable synthetic resin film, thereby to further inhibit the chemical reaction between the semiconductor layer and curable synthetic resin film. Since no chemical reaction occurs between the harrier layer and semiconductor layer, the semiconductor layer is never degraded. An increase in dark current can be prevented by forming the high resistance film between the common electrode and semiconductor layer. The barrier layer which is adhesive to the curable synthetic resin film can reduce concentration of distortion due to mechanical stress. Further, with the semiconductor layer and curable synthetic resin film held between the auxiliary plate and matrix substrate, it is possible to provide a radiation detector free from warpage and cracking due to temperature change.

DESCRIPTION OF REFERENCES

Figure 1:
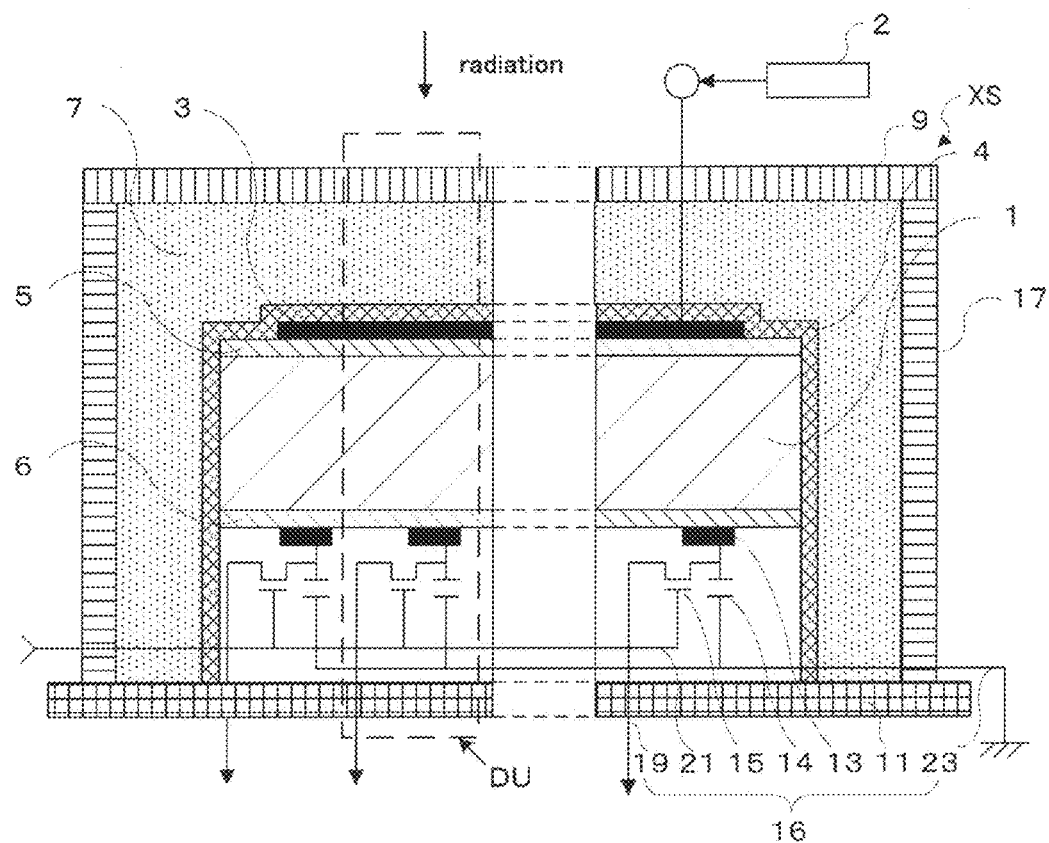
FIG. 1 is a schematic view in vertical section showing a construction of a radiation detector according to an embodiment.

1 . . . amorphous semiconductor layer
2 . . . bias voltage source
3 . . . common electrode
4 . . . barrier layer
5 . . . carrier selective high resistance film
6 . . . carrier selective high resistance film
7 . . . curable synthetic resin film
9 . . . insulating auxiliary plate
11 . . . insulating substrate
13 . . . pixel electrodes
14 . . . carrier storage capacitors
15 . . . switching elements
16 . . . active matrix substrate
17 . . . spacer
19 . . . data lines
21 . . . gate lines
23 . . . ground lines
XS . . . radiation detector
DU . . . detecting elements Embodiment 1

An embodiment of this invention will be described hereinafter with reference to the drawings.

Figure 2:
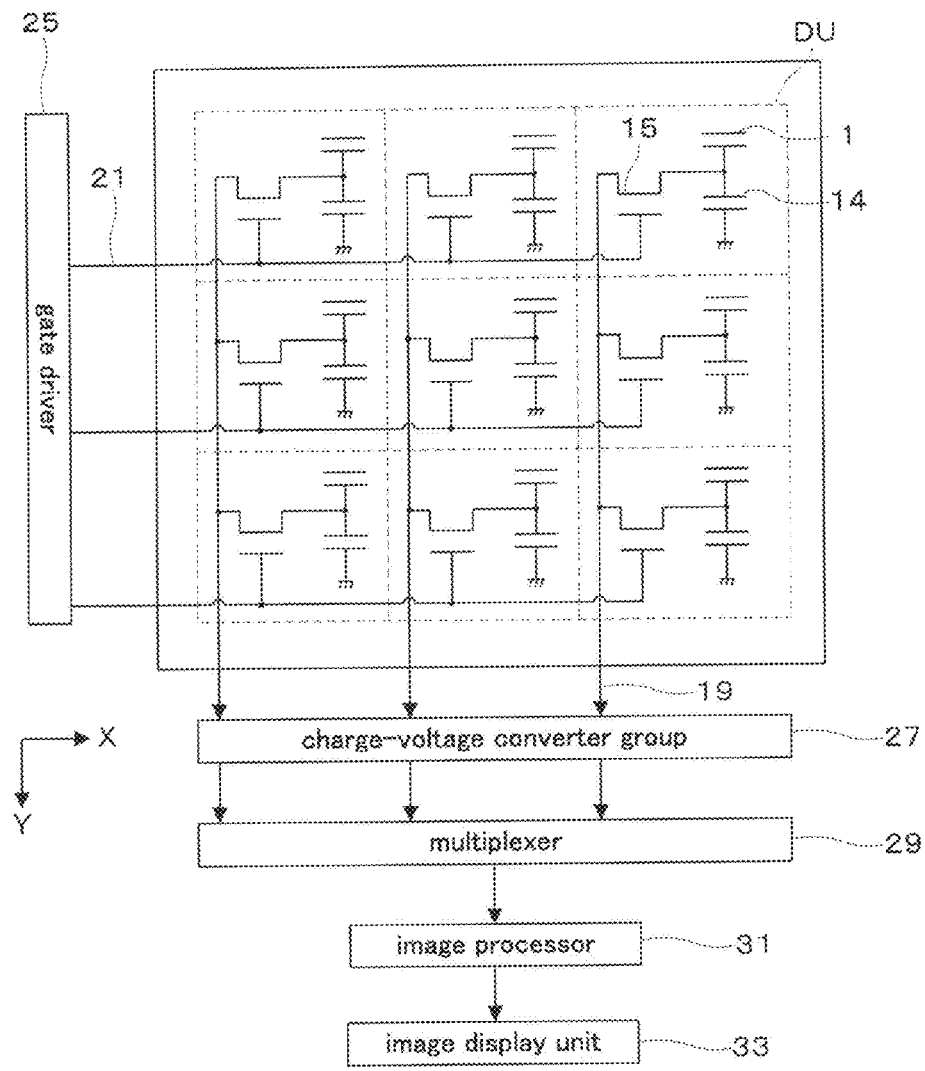
FIG. 2 is a circuit diagram showing a construction of an active matrix substrate and peripheral circuits according to the embodiment.
Figure 3:
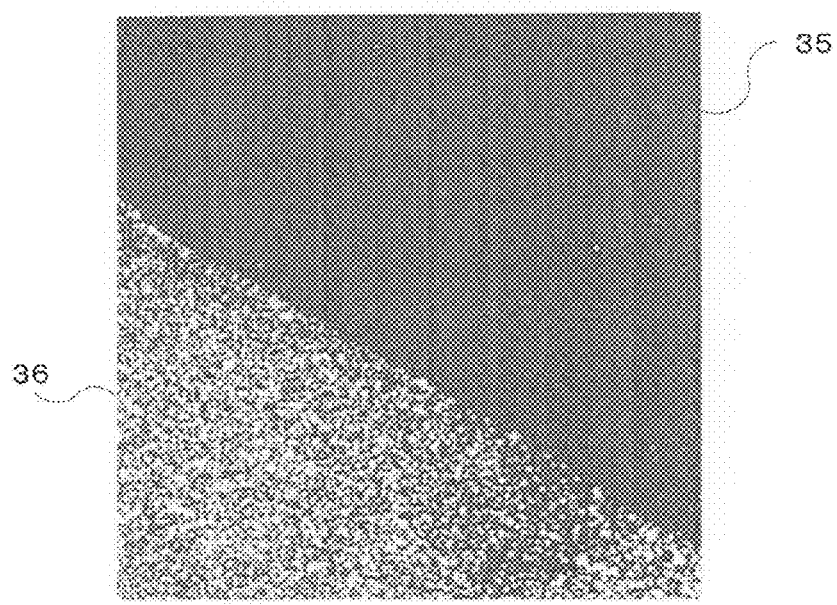
FIG. 3 is a photographic view showing effects of the embodiment.
Figure 4:
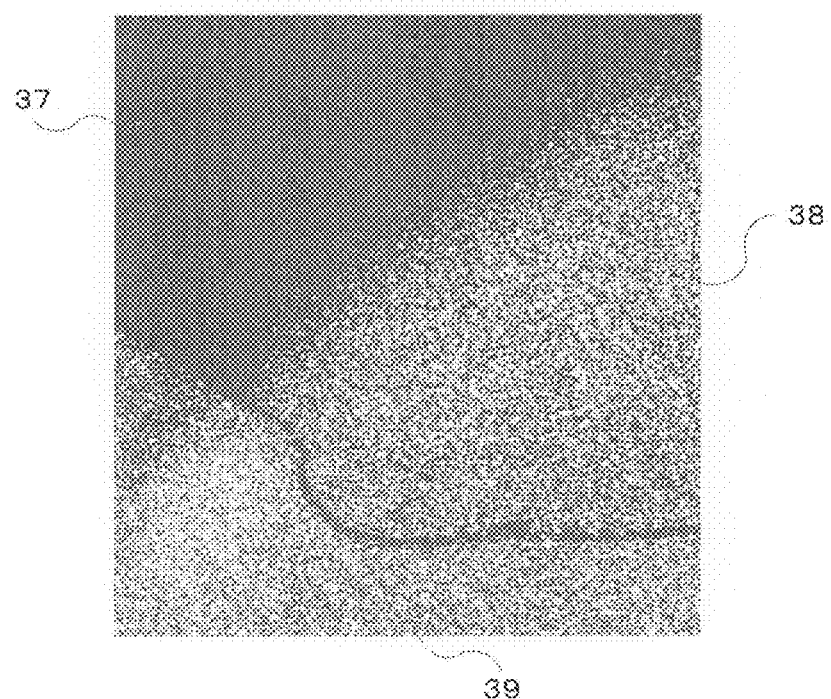
FIG. 4 is a photographic view showing effects of the embodiment.

FIG. 1 is a schematic view in vertical section showing a construction of a radiation detector XS according to the embodiment. FIG. 2 is a circuit diagram showing a construction of a radiographic apparatus including peripheral circuits electrically connected to an active matrix substrate 10 in the radiation detector XS. FIGS. 3 and 4 are photographic views showing effects of this embodiment. Like reference signs are used to identify like parts which are the same as in the prior art.

<<Radiation Detector>>

The radiation detector XS in this embodiment, as shown in FIG. 1, has, formed under a common electrode 3 to which a bias voltage is applied from a bias voltage source 2, a carrier selective high resistance film 5 which selects and transmits carriers, and formed still thereunder is an amorphous semiconductor layer 1 which generates carriers upon incidence of radiation. That is, as a bias voltage is applied to the common electrode 3, the bias voltage is applied to the carrier selective high resistance film 5 and amorphous semiconductor layer 1. And a carrier selective high resistance film 6 is again formed under the amorphous semiconductor layer 1. Formed further thereunder is an active matrix substrate 16 which includes pixel electrodes 13 for collecting the carriers on a pixel-by-pixel basis, carrier storage capacitors 14 for storing the carriers collected by the pixel electrodes 13, switching elements 15 and ground lines 23 electrically connected to the carrier storage capacitors 14, gate lines 21 for sending signals for switching action to the switching elements 15, data lines 19 for reading, through the switching elements, electric charges stored in the carrier storage capacitors 14, and an insulating substrate 11 for supporting these components. The carriers generated in the amorphous semiconductor layer 1 can be read on a pixel-by-pixel basis by this active matrix substrate 16. The amorphous semiconductor layer 1 corresponds to the radiation sensitive semiconductor layer in this invention. The carrier selective high resistance film 5 corresponds to the high resistance film in this invention. The gate lines 21 and data lines 19 correspond to the electrode wires in this invention. The active matrix substrate 16 corresponds to the matrix substrate in this invention.

And a barrier layer 4 is formed to cover all of the common electrode 3, carrier selective high resistance film 5 and amorphous semiconductor layer 1 from the insulating substrate 11 of the active matrix substrate 16, and a curable synthetic resin film 7 is formed further to cover it. An insulating auxiliary plate 9 is formed on an upper surface of the curable synthetic resin film 7. The barrier layer 4 will be described in detail hereinafter.

The amorphous semiconductor layer 1 is a high purity a-Se thick film with a specific resistance of $10^9$ Ωcm or more (preferably, $10^{11}$ Ωcm or more), and a thickness of 0.5 mm to 1.5 mm. This a-Se thick film can facilitate enlargement of a detecting area if the amorphous semiconductor layer 1 were thin, radiation would be transmitted without being converted. Thus, a thick film of 0.5 mm to 1.5 mm is used.

The common electrode 3 and pixel electrodes 13 are formed of metal, such as Au, Pt, Ni or In, or ITO. Of course, the material for the amorphous semiconductor layer 1 and the material for the electrodes are not limited to the examples given above.

The carrier selective high resistance film 5 is dependent on whether the bias voltage applied to the common electrode 3 is a positive bias or a negative bias. A film with high hole injection blocking capability is employed in the case of a positive bias, and a film with high electron injection blocking capability in the case of a negative bias. Generally, when used for a positive bias, an n-type (the majority carriers being electrons) selective film is used as the carrier selective high resistance film 5. When used for a negative bias, a p-type (the majority carriers being holes) selective film is used as the carrier selective high resistance film 5. However, since the general rule may not necessarily be valid in a high resistance domain of $10^9$ Ωcm or more, it can be effective to use, for a positive bias, a $Sb_2Te_3$, $Sb_2S_3$ or ZnTe film exemplifying a p-type layer. An n-type layer is exemplified by a CdS or ZnS film. The specific resistance of the high resistance film 5, preferably, is $10^9$ Ωcm or more. An appropriate thickness of the high resistance film 5 is 0.1 μm to 5 μm.

The auxiliary plate 9 with a thermal expansion coefficient comparable to that of the insulating substrate 11, preferably, has a high radiation transmittance, and quartz glass is used, for example. An appropriate thickness thereof is 0.5 mm to 1.5 mm. As long as it is formed to prevent warping of the amorphous semiconductor layer 1, the auxiliary plate 9 is not limited to the above embodiment, but may be embodied in any form.

In this embodiment, an epoxy resin is employed as the curable synthetic resin film 7 of high withstand voltage. An epoxy resin has a high degree of hardness, and also is highly adhesive to the auxiliary plate 9. When curing the epoxy resin, it can be cured at normal temperature below 40° C. and will never crystallize a-Se. When a different resin is selected as the curable synthetic resin film 7, an upper limit of curing temperature is determined by the type of semiconductor employed as the semiconductor layer 1. When a-Se is used as noted above, since a-Se is easily crystallized by heat, it is necessary to select, a synthetic resin of the type that cures at normal temperature below 40° C.

The formation thickness of these curable synthetic resin films 7, considering that, when it is too thin, the withstand voltage will lower, and when too thick, incident radiation will attenuate, is selected to provide a gap of 1 mm to 5 mm, preferably 2 mm to 4 mm, between the insulating substrate 11 and auxiliary plate 9. In order to form this gap reliably, a spacer 17 formed of ABS resin is provided peripherally of the insulating substrate 11. The gap can be adjusted by providing the spacer 17 between the auxiliary plate 9 and active matrix substrate 16 in this way.

Numerous pixel electrodes 13 are formed in a two-dimensional array, one carrier storage capacitor 14 is provided for storing carriers collected by each pixel electrode 13, and one switching element 15 for reading the carriers. Thus, the radiation detector XS in this embodiment serves as a flat panel radiation sensor of two-dimensional array construction with numerous detecting elements DU which are radiation detection pixels arranged along X- and Y-directions (see FIG. 2). This allows local, radiation detection to be made for each radiation detection pixel, thereby enabling measurement of a two-dimensional distribution of radiation intensities.

The gates of thin-film transistors which cause switching of the switching elements 15 of the detecting elements DU are connected to the gate lines 21 in the horizontal (X) direction, while the drains are connected to the data lines 19 in the vertical (Y) direction.

And, as shown in FIG. 2, the data lines 19 are connected to a multiplexer 29 through a charge-voltage converter group 27, and the gate lines 21 are connected to a gate driver 25. The detecting elements DU of the radiation sensor are identified based on addresses assigned to the respective detecting elements DU in order along the arrangements in the X- and Y-directions. Therefore, scan signals for signal fetching serve as signals designating the addresses in the X-direction or the addresses in the Y-direction, respectively. Although FIG. 2 shows a matrix construction for 3×3 pixels for expediency of illustration, the active matrix substrate 16 in use actually has a size matched to the number of pixels of the radiation detector XS.

The detecting elements DU are selected on a row-by-row basis as the gate driver 25 applies a fetching voltage to the gate lines 21 in the X-direction in response to the scan signals in the Y-direction. And with the multiplexer 29 switched by the scan signals in the X-direction, the charges stored in the carrier storage capacitors 14 of the detecting elements DU in the selected rows will be sent out successively through the charge-voltage converter group 27 and multiplexer 29.

Specifically, a radiation detecting operation by the radiation detector XS in this embodiment is as follows. Upon incidence of radiation to be detected in the state of the bias voltage applied to the common electrode 3 on the front surface of the amorphous semiconductor layer 1, carriers (electron-hole pairs) generated by incidence of the radiation move to the common electrode 3 and pixel electrodes 13 due to the bias voltage. Charges corresponding to the number of carriers generated are stored in the carrier storage capacitors 14 adjacent the pixel electrodes 13. As the carrier readout switching elements 15 are changed to ON sate, the charges stored are read as radiation detection signals via the switches 15, to be converted into voltage signals by the charge-voltage converter group 27.

Where the radiation detector XS in this embodiment is used as an X-ray detector of an X-ray fluoroscopic apparatus, for example, after the detection signals of the detecting elements DU are fetched in order as pixel signals from the multiplexer 29, required signal processing such as a noise process is carried out by an image processor 31, and then a two-dimensional image (X-ray fluoroscopic image) is displayed by an image display unit 33.

In manufacturing the radiation detector XS in this embodiment, thin-film transistors for the switching elements 15, carrier storage capacitors 14, pixel electrodes 13, carrier selective high resistance film 6, amorphous semiconductor layer 1, carrier selective high resistance film 5 and common electrode 3 are laminated and formed in order on the surface of the insulating substrate 11, using a thin film forming technique by varied vacuum film formation method or a patterning technique by photolithographic method.

<<Barrier Layer>>

For the barrier layer 4, a polycarbonate resin is dissolved to be liquefied in a solvent such as xylene or dichlorobenzene, which is then applied onto the amorphous semiconductor layer 1, high resistance film 5, and common electrode 3. And a polycarbonate resin film is formed as the barrier layer 4 by volatilization at normal temperature below 40° C. According to this method, the barrier layer 4 can be formed without using a synthetic resin and solvent including an amine compound. Since no chemical reaction occurs between the barrier layer 4 and amorphous semiconductor layer 1, the dark current characteristic of the amorphous semiconductor layer 1 will never be worsened. The formation of the barrier layer 4 prevents an amine compound included in the curing agent of the epoxy resin which is the curing agent synthetic resin film 7 from permeating the amorphous semiconductor layer 1, and can inhibit a chemical reaction.

The polycarbonate resin is desirable since it is highly adhesive to the epoxy resin of curable synthetic resin film 7. Silicone resin and polytetrafluoroethylene resin also have excellent insulation properties as the barrier layer 4, but are not desirable because of poor adhesiveness to the epoxy resin. When adhesiveness is poor, a gap can be formed between joint surfaces of the curable synthetic resin film 7 and barrier layer 4, where a mechanical stress of distortion of the insulating substrate 11 concentrates due to temperature change. There is a possibility that this becomes a point of origin for cracking of the amorphous semiconductor layer 1, common electrode 3 and carrier selective high resistance film 5.

It is preferred that the thickness of the barrier layer 4 is larger than the thickness of the carrier selective high resistance film 5. Specifically, it should be 1 µm to 500 µm, preferably 10 µm to 100 µm. The thickness of the barrier layer 4 fulfilling the above condition can eliminate the influence of incomplete density of the high resistance film 5, and can prevent a chemical reaction between the amine compound of the epoxy resin and the amorphous semiconductor layer 1.

<<Comparative Experiment>>

FIGS. 3 and 4 show photos illustrating the amorphous semiconductor layer 1 being protected by the barrier layer 4 against degradation by the amine compound of the curable synthetic resin film 7.

In FIG. 3, the area of an upper right portion 35 of the photo is where the harrier layer 4 is formed in a thickness of 1 µm or more on the upper surfaces of the amorphous semiconductor layer 1, carrier selective high resistance film 5 and common electrode 3, and the area of a lower left portion 36 of the photo is an area where the barrier layer 4 is not formed. And an epoxy resin containing twice the usual quantity of a curing agent including an amine compound is applied directly onto the planes of both areas and, after curing, is left standing under a 35° C. temperature condition for a long time. FIG. 3 is an image of dark current measured subsequently, without emitting radiation. This shows clearly that the amorphous semiconductor layer 1 has deteriorated in the area where the harrier layer 4 is not formed. It is also shown that the amorphous semiconductor layer 1 is protected by the harrier layer 4, and thus no increase of dark current.

In FIG. 4, the area of an upper left portion 37 of the photo is where the barrier layer 4 is formed in a thickness of 1 µm or more on the upper surfaces of the amorphous semiconductor layer 1, carrier selective high resistance film and common electrode 3, the area of a right portion 38 of the photo is where the thickness of the harrier layer 4 is 1 µm or less, and the area of a lower portion 39 of the photo is an area where the barrier layer 4 is not formed. As is FIG. 3, this is an image of dark current measured without emitting radiation, after direct application of an epoxy resin containing twice the usual quantity of a curing agent including an amine compound, which, after curing, is left standing at 35° C. for a long time. This shows that, with the thickness of the barrier layer 4 being 1 µm or less, the amine compound of the epoxy resin permeates the barrier layer, and chemically reacts with the amorphous semiconductor layer 1, thereby degrading the dark current characteristic.

<<Effects of This Embodiment>>

The radiation detector XS constructed as described above has the barrier layer 4 of a non-amine compound formed between the entire exposed surfaces of the amorphous semiconductor layer 1, carrier selective high resistance film 5 and common electrode 3, and the curable synthetic resin film 7, thereby to prevent the chemical reaction between the amorphous semiconductor layer 1 and the amine compound of the curable synthetic resin film 7 and to in an increase in dark current. Of course, there will occur no deterioration of the surface of the amorphous semiconductor layer 1, no creeping discharge, and no lowering of voltage resistance. Since no chemical reaction occurs between the harrier layer 4 and amorphous semiconductor layer 1, the amorphous semiconductor layer 1 is never degraded. The barrier layer 4 which is adhesive to the curable synthetic resin film 7 can reduce concentration of distortion due to mechanical stress.

Since a cold curing type epoxy resin is used as the curable synthetic resin film 7, the amorphous semiconductor will never crystallize when the curable synthetic resin film 7 is cured.

The auxiliary plate 9 with a thermal expansion coefficient comparable to that of the insulating substrate 11 is fixedly formed to cover the top surface of the curable synthetic resin film 7 of high withstand voltage. The amorphous semiconductor layer 1, carrier selective high resistance film 5 and common electrode 3 which are relatively inferior in tensile strength are fixed as pinched through the curable synthetic resin film 7 between the auxiliary plate 9 and insulating substrate 11. Therefore, warpage due to temperature change does not occur with the radiation detector XS. For the same reason, cracking of the amorphous semiconductor layer 1, common electrode 3 and carrier selective high resistance film 5 decreases sharply. Moreover, the auxiliary plate 9 and curable synthetic resin film 7 of high withstand voltage function also as protective films for the amorphous semiconductor layer 1 which is relatively inferior in resistance to environment.

This invention is not limited to the foregoing embodiment, but may be modified as follows:

[Modifications]

Figure 5:
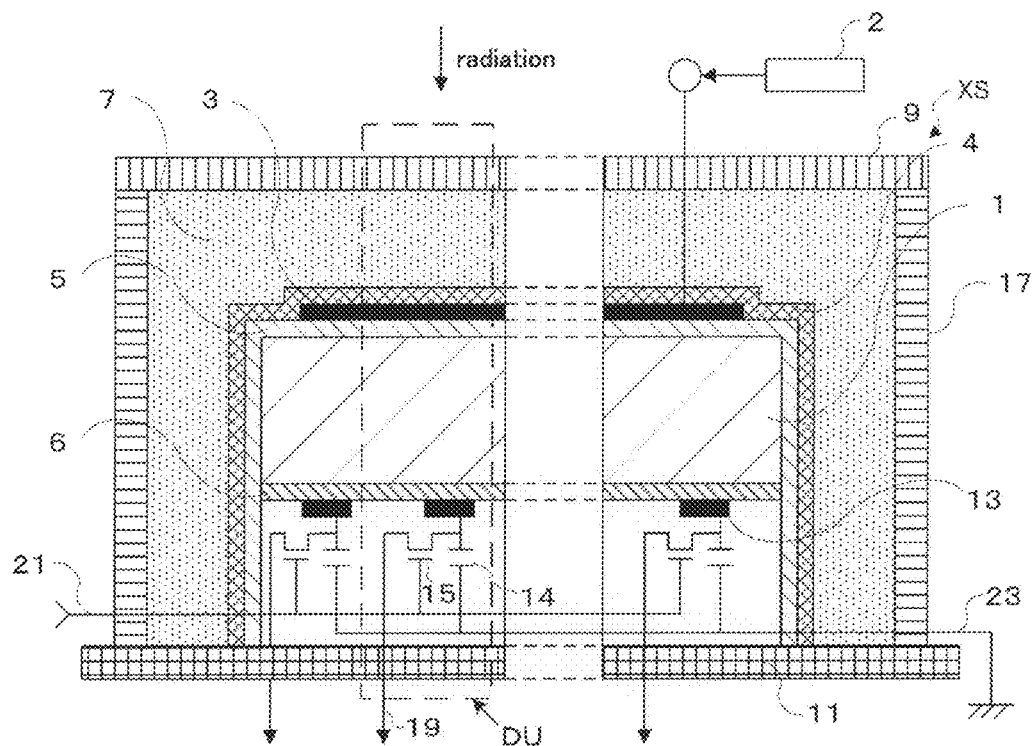
FIG. 5 is a schematic view in vertical section showing a construction of a radiation detector according to another embodiment of this invention.
Figure 6:
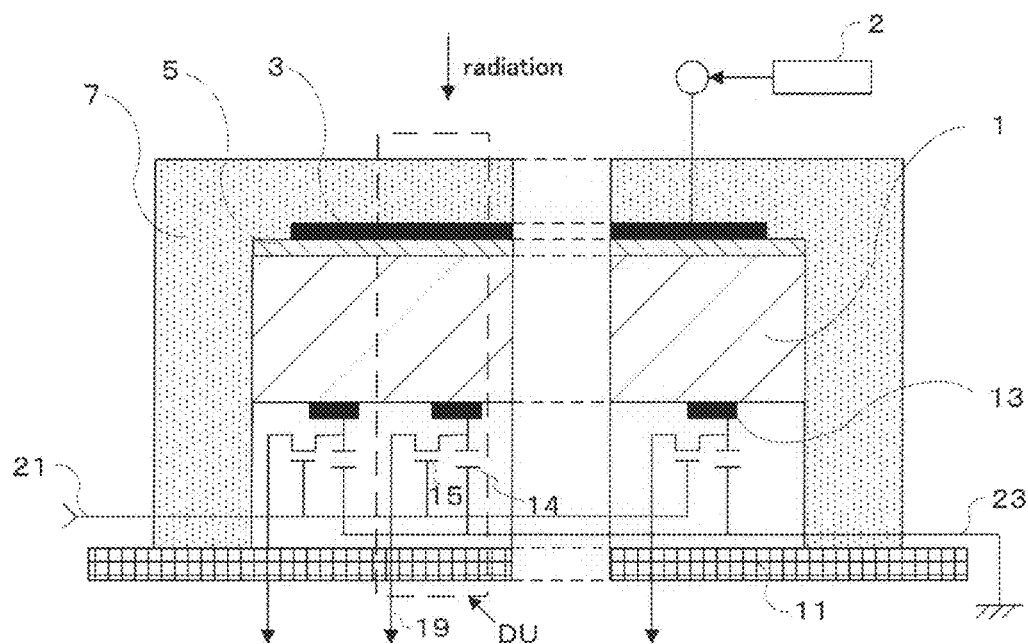
FIG. 6 is a schematic view in vertical section showing a construction of a radiation detector in the prior art.
Figure 7:
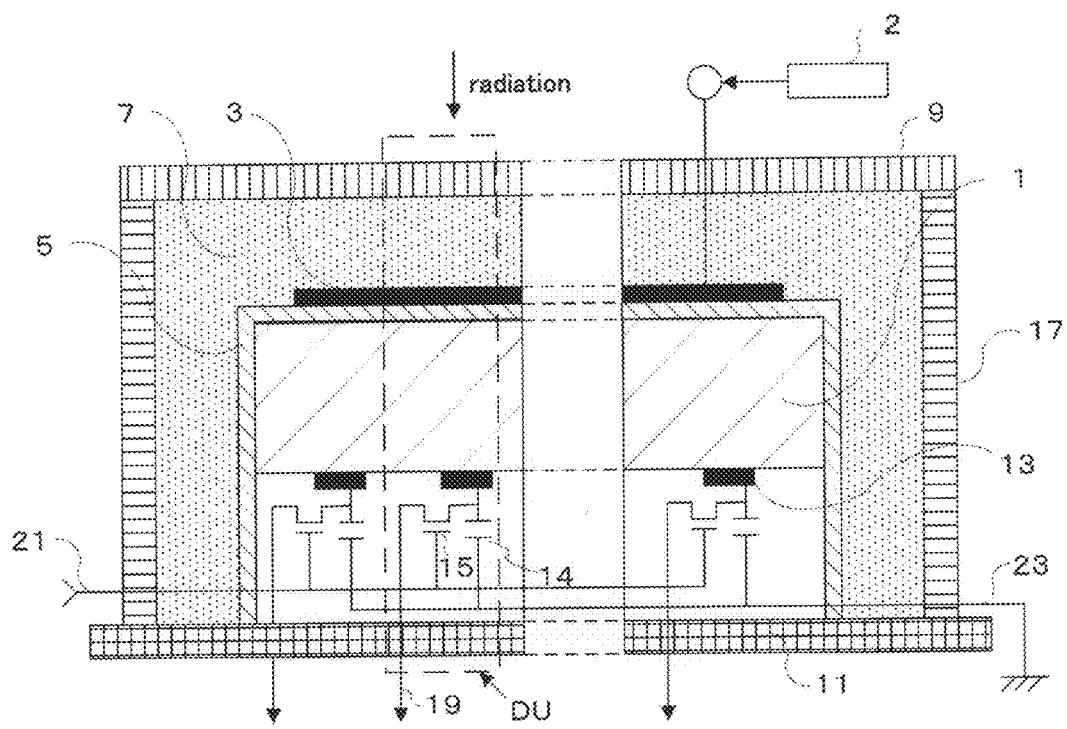
FIG. 7 is a schematic view in vertical section showing a construction of a radiation detector in the prior art.
Figure 8:
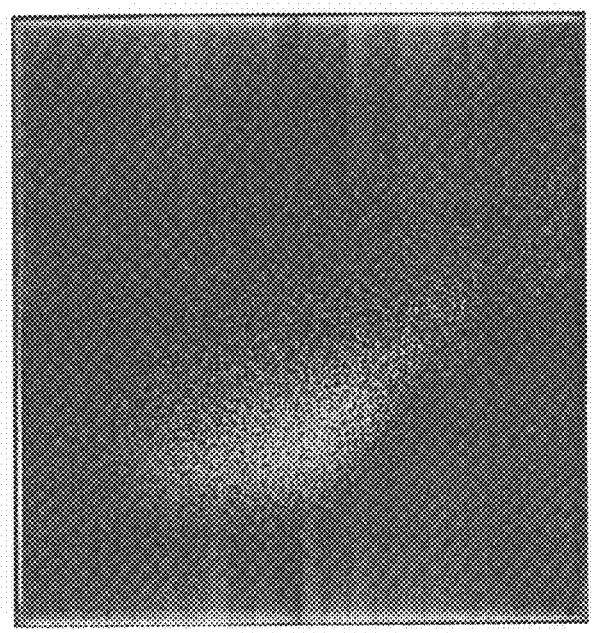
FIG. 8 is a photographic view showing an increase in dark current of the X-ray detector in the prior art.
Figure 9:
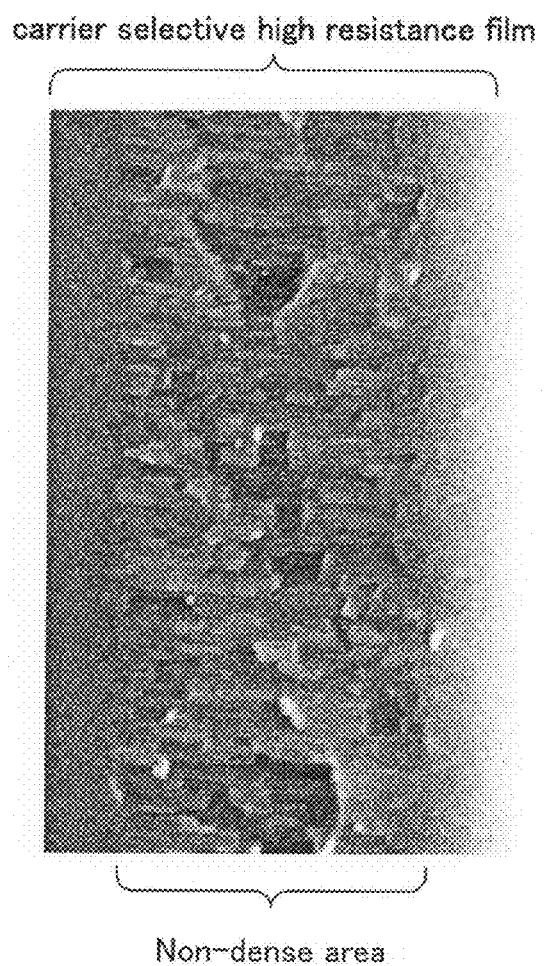
FIG. 9 is an electron micrographic view showing a vertical section of a carrier selective high resistance film of the X-ray detector in the prior art.

(1) In the foregoing embodiment, the carrier selective high resistance film 5 is formed only between the amorphous semiconductor layer 1 and bias voltage source 2, but this is not limitative. As shown in FIG. 5, it may be formed to cover the whole amorphous semiconductor layer 1 from the insulating substrate 11. The barrier layer 4 is formed on the surfaces of the high resistance film 5 formed in this way, and the curable synthetic resin film 7 is further formed thereon. This results in the amine compound of the curable synthetic resin film 7 doubly protected by the barrier layer 4 and high resistance film 5. Consequently, the amorphous semiconductor layer 1 is less likely to undergo a chemical reaction, thereby providing a radiation detector for detecting radiation with increased stability.

(2) In the foregoing embodiment, a resin is dissolved in a solvent as the barrier layer 4, and this solution is applied and the solvent is volatilized to form the barrier layer 4. Instead of being limited to this, a two-component type, non-amine, cold curable synthetic resin may also be employed. A polycarbonate resin and urethane resin may be cited as examples. The barrier layer 4 may be formed by applying and photo-curing a photo-curable synthetic resin. In this case, a photo-curable resin which does not chemically react with the amorphous semiconductor layer 1 is desirable, which may, for example, be an acrylic resin containing mercaptoester.

(3) In the foregoing embodiment, a resin is dissolved in a solvent as the barrier layer 4, and this solution is applied and the solvent is volatilized to form the barrier layer 4. Instead of being limited to this, the barrier layer 4 may be formed by evaporating a non-amine synthetic resin such as polyparaxy-lylene in a vacuum, and attaching it as a polyparaxy-lylene film to the amorphous semiconductor layer 1. In this case, it is desirable to attach it while cooling the substrate including the amorphous semiconductor layer 4, so that the temperature of the amorphous semiconductor layer 4 may not be raised to 40° C. or higher.

(4) In the foregoing embodiment, an organic insulating resin is dissolved in a solvent as the barrier layer 4, and this solution is applied and the solvent is volatilized to form the barrier layer 4. Instead of being limited to this, the barrier layer 4 may be formed by vacuum-depositing $Sb_2S_3$ used also for the carrier selective high resistance film 5 or 6. In the prior art, the thickness of $Sb_2S_3$ is restricted in order to be inserted between the amorphous semiconductor layer 1 and common electrode 3 and to retain the carrier transport property. Since $Sb_2S_3$ serves the purpose of inhibiting the chemical reaction between the amorphous semiconductor layer 1 and curable synthetic resin film 7, and not selecting carriers, the film can be formed without a restriction on thickness. Since it is not necessary to consider carrier selection, a different, inorganic high resistance film may be formed as the barrier layer 4. Preferably, the specific resistance of the inorganic high resistance film is $10^9$ Ωm or more.

(5) In the foregoing embodiment, the active matrix substrate 16 is employed as the matrix substrate. A passive matrix substrate may be employed instead.

The invention claimed is:

1. A radiation detector comprising (a) a radiation sensitive semiconductor layer for generating carriers upon incidence of radiation, (b) a high resistance film formed on an upper surface of the semiconductor layer for selecting and transmitting the carriers, (c) a common electrode formed on an upper surface of the high resistance film for applying a bias voltage to the high resistance film and the semiconductor layer, (d) a matrix substrate formed on a lower surface of the semiconductor layer for reading, on a pixel-by-pixel basis, the carriers generated in the semiconductor layer, (e) a barrier layer covering entire exposed surfaces of the semiconductor layer, the high resistance film and the common electrode, (f) a curable synthetic resin film covering an entire surface of the barrier layer, and (g) an insulating auxiliary plate fixed to an upper surface of the curable synthetic resin film, and having a thermal expansion coefficient comparable to that of the matrix substrate, wherein (h) the barrier layer is adhesive to the curable synthetic resin film, (i) the barrier layer inhibits a chemical reaction between the semiconductor layer and the curable synthetic resin film, and (j) the barrier layer does not chemically react with the semiconductor layer.

2. The radiation detector according to claim 1, wherein the matrix substrate is an active matrix substrate having pixel electrodes for collecting, on a pixel-by-pixel basis, the carriers generated in the semiconductor layer, capacitors for storing charges corresponding to the number of carriers collected by the pixel electrodes, switching elements for reading the charges stored, and electrode wires arranged in a grid pattern and connected to the switching elements arranged at respective grid points.

3. The radiation detector according to claim 1, wherein the semiconductor layer is amorphous selenium.

4. The radiation detector according to claim 1, wherein the curable synthetic resin film is an epoxy resin.

5. The radiation detector according to claim 1, wherein the barrier layer is thicker than the high resistance film.

6. The radiation detector according to claim 5, wherein the barrier layer is a non-amine synthetic resin.

7. The radiation detector according to claim 6, wherein the barrier layer is a synthetic resin formed at a temperature below 40° C.

8. The radiation detector according to claim 7, wherein the non-amine synthetic resin is a polycarbonate resin, an acrylic resin or a urethane resin.

9. The radiation detector according to claim 7, wherein the barrier layer is a photo-curable resin, and is cured and formed by light irradiation.

10. The radiation detector according to claim 7, wherein the barrier layer is formed by attaching the non-amine synthetic resin by vacuum vapor deposition to entire surfaces of the semiconductor layer, the high resistance film and the common electrode.

11. The radiation detector according to claim 10, wherein the non-amine synthetic resin is polyparaxy-lylene.

12. The radiation detector according to claim 5, wherein the barrier layer is an inorganic high resistance film formed separately from the high resistance film.

13. The radiation detector according to claim 12, wherein the inorganic high resistance film is an $Sb_2S_3$ film.

14. The radiation detector according to claim 1, further comprising a spacer for gap adjustment disposed between the auxiliary plate and the matrix substrate.

* * * * *